United States Patent [19]
Brooks et al.

[11] Patent Number: 6,068,088
[45] Date of Patent: *May 30, 2000

[54] RELEASABLE SEMICONDUCTOR WAFER LIFTER BASKET

[75] Inventors: Warren Scott Brooks, Essex Junction; Steven Todd Drexler, Milton; Kristen Erikson Jewell, Underhill, all of Vt.

[73] Assignee: International Business Machines Corporation, Armonk, N.Y.

[*] Notice: Under 35 U.S.C. 154(b), the term of this patent shall be extended for 460 days.

[21] Appl. No.: 08/517,181
[22] Filed: Aug. 21, 1995
[51] Int. Cl.$^7$ ...................................................... B66B 5/00
[52] U.S. Cl. ................... 187/349; 414/935; 414/941; 414/217; 118/719; 187/223; 187/273; 187/300
[58] Field of Search ..................... 187/223, 229, 187/234, 272, 273, 300, 349, 279, 281; 414/21, 935, 939, 618, 217, 645, 941, 662; 118/719

[56] References Cited

U.S. PATENT DOCUMENTS

| | | | |
|---|---|---|---|
| 1,016,386 | 2/1912 | Ball | 187/349 |
| 1,257,336 | 2/1918 | Gagnon | 187/279 |
| 1,292,236 | 1/1919 | Blondi | 187/349 |
| 1,533,576 | 4/1925 | Torrance | 187/349 |
| 5,219,043 | 6/1993 | Eriksson et al. | 187/349 |
| 5,636,963 | 6/1997 | Haraguchi et al. | 414/935 X |

FOREIGN PATENT DOCUMENTS

| | | | |
|---|---|---|---|
| 130540 | 5/1989 | Japan | 187/279 |
| 5-36814 | 2/1993 | Japan . | |
| 268350 | 4/1970 | U.S.S.R. | 187/281 |
| 648043 | 12/1950 | United Kingdom | 187/349 |

*Primary Examiner*—Frank E. Werner
*Attorney, Agent, or Firm*—Heslin & Rothenberg, P.C.; Wayne F. Reinke, Esq.

[57] ABSTRACT

A wafer lifter basket assembly includes a wafer lifter basket and a base, the base including a bracket and a bracket holder. The wafer lifter basket is mounted to the bracket, and the bracket holder is releasably connected to the bracket holder via spring-loaded plungers, which release upon the wafer lifter basket encountering a force of at least a predetermined level.

7 Claims, 4 Drawing Sheets

RELEASABLE SEMICONDUCTOR WAFER LIFTER BASKET

BACKGROUND OF THE INVENTION

1. Technical Field

The present invention generally relates to the handling of semiconductor wafers during processing. More particularly, the present invention relates to a semiconductor wafer transportation system for moving a semiconductor wafer during processing, such that the likelihood of damage to a semiconductor wafer is reduced.

2. Background Information

At different stages of semiconductor wafer processing, the semiconductor wafer must be transported into and out of various processing stations. In the past, the mechanisms used to transport semiconductor wafers into and out of processing stations have sometimes caused damage to improperly placed wafers. For example, a wafer that falls off a wafer lifter basket may be crushed by the basket. In some situations, this problem has been addressed through the use of sensors to track whether a semiconductor wafer is properly placed on such a lifter basket. However, the addition of such sensors and controls therefor complicates the wafer processing and adds significant cost. Therefore, the destruction of a low percentage of wafers, due to wafer lifter basket mishandling has been accepted.

Thus, a need exists for a less expensive and simpler way to address the problem of semiconductor wafer damage during transportation in processing.

SUMMARY OF THE INVENTION

Briefly, the present invention satisfies the need for an inexpensive and simple way to address the problem of wafer damage during transportation in processing, by providing a wafer lifter basket assembly where the wafer lifter basket is released from the base upon encountering a force of at least a predetermined level.

In accordance with the above, it is an object of the present invention to reduce the likelihood and extent of damage to semiconductor wafers during transportation in processing.

It is another object of the present invention to provide a semiconductor transportation system where the apparatus holding the semiconductor wafer is released upon encountering a force that may cause damage to the semiconductor wafer.

The present invention provides, in a first aspect, a semiconductor wafer lifter basket assembly for transporting a semiconductor wafer during processing thereof, the assembly comprising a base and a wafer lifter basket releasably coupled to the base such that the wafer lifter basket releases from the base in response to encountering a force of at least a predetermined level. The base may comprise a pair of spring-loaded plungers for releasably coupling the wafer lifter basket to the base. The pair of spring-loaded plungers may be tension-adjustable. The base may further comprise a bracket to which the wafer lifter basket is mounted, and a bracket holder, the pair of spring-loaded plungers releasably holding the bracket to the bracket holder. The wafer lifter basket may include a protruding connection area, the wafer lifter basket being mounted to the bracket at the protruding connection area such that positioning of the wafer lifter basket with respect to the bracket is adjustable. In addition, the pair of spring-loaded plungers may be based in the bracket holder. The force necessary to release the wafer lifter basket may be greater than about the weight of a semiconductor wafer.

The present invention provides, in a second aspect, a method of reducing potential damage to a semiconductor wafer during transport in processing thereof in a semiconductor wafer processing system including a semiconductor wafer lifter basket assembly of the first aspect of the invention. The method comprises steps of: attempting to transport the semiconductor wafer within the semiconductor wafer processing system via the semiconductor wafer lifter basket assembly; encountering a force of at least a predetermined level on the wafer lifter basket; and releasing the wafer lifter basket from the base in response to the encountered force. The encountered force may be from above or below the wafer lifter basket. Where the pair of spring-loaded plungers is included, the step of releasing may comprise the pair of spring-loaded plungers releasing the wafer basket. Where the plungers are tension-adjustable, the method may further comprise a step of adjusting the tension on the plungers to establish the predetermined force level.

The present invention provides, in a third aspect, a method of modifying an existing semiconductor wafer lifter basket assembly including a base and a wafer lifter basket hard-mounted to the base. The method comprises steps of: separating the wafer lifter basket from the base; replacing the base with a bracket and a bracket holder; mounting the wafer lifter basket to the bracket; and releasably connecting the bracket with the bracket holder, such that the wafer lifter basket and bracket are released from the bracket holder in response to encountering a force of at least a predetermined level. The step of releasably connecting may comprise releasably connecting the bracket and bracket holder via a pair of spring-loaded plungers. Where the plungers are tension-adjustable, the step of releasably connecting may further comprise setting the spring-loaded plungers to establish the predetermined level of force.

These, and other objects, features and advantages of this invention will become apparent from the following detailed description of the various aspects of the invention taken in conjunction with the accompanying drawings.

BEST MODE FOR CARRYING OUT THE INVENTION

Figure 1:
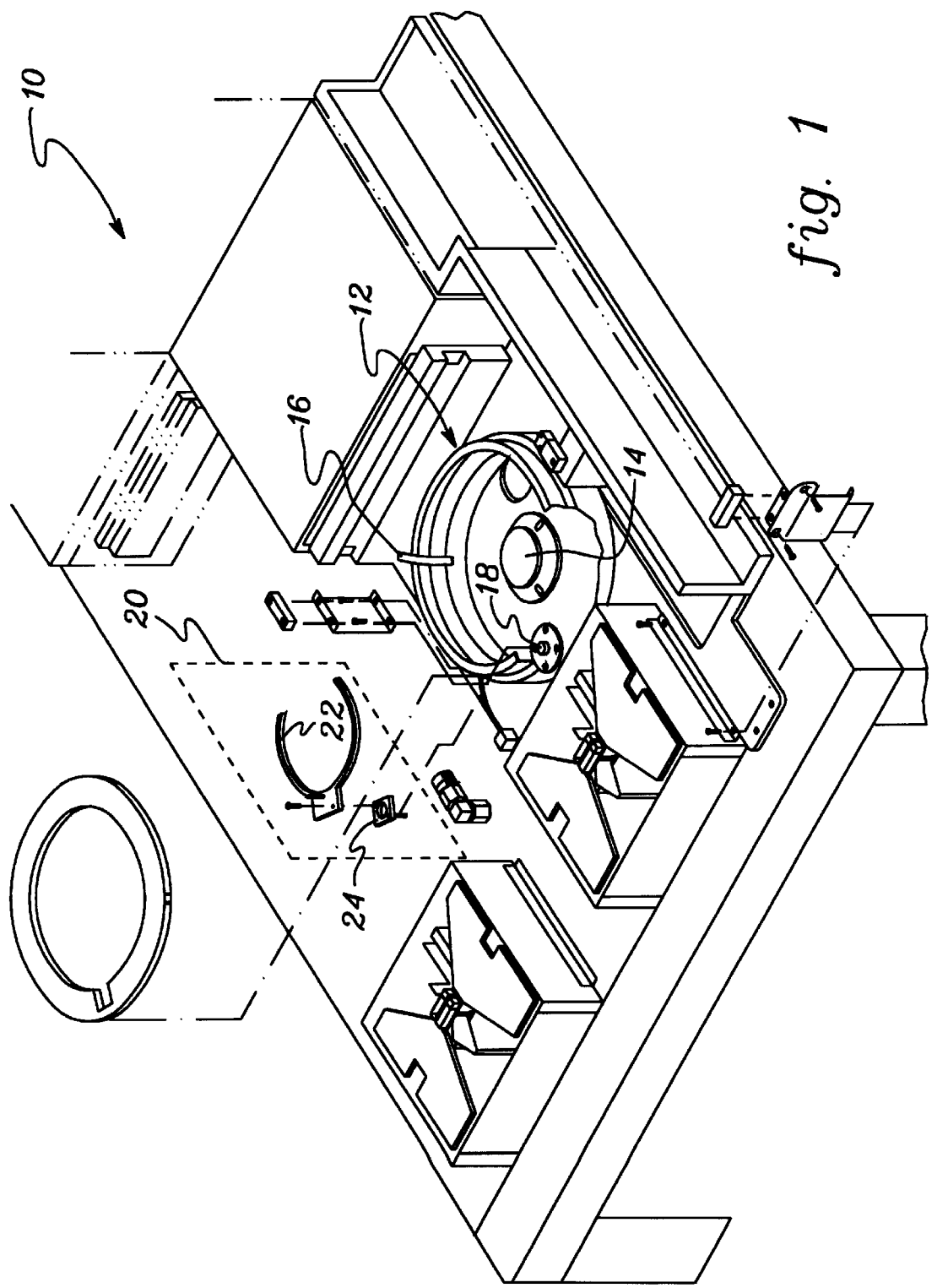
FIG. 1 depicts an atmospheric passivation module including a wafer lifter basket hard-mounted to a base, such that the wafer lifter basket cannot be released therefrom.

FIG. 1 depicts an atmospheric passivation module 10 (hereinafter, "APM") for processing a semiconductor wafer. APM 10 comprises a wafer passivation area 12, vacuum spinner chuck 14, water nozzle 16, actuator 18 and wafer lifter basket assembly 20. Wafer lifter basket assembly 20 transports a semiconductor wafer into and out of wafer passivation area 12, and comprises a wafer lifter basket 22 hard-mounted to a base 24, which is connected to and moves up and down via actuator 18, a pneumatic plunger that raises and lowers. A semiconductor wafer (not shown) rests on wafer lifter basket 22 and is lowered into wafer passivation area 12 and onto vacuum spinner chuck 14. Vacuum spinner chuck 14 holds the wafer by a vacuum and spins the wafer at speeds of up to 2,000 rpm, while water is sprayed thereonto from water nozzle 16 to passivate the wafer. When passivation is complete, the vacuum is released, and the wafer lifter basket assembly 20 raises the wafer out of wafer passivation area 12 for further processing. However, if a wafer is improperly placed onto wafer lifter basket 22, the wafer may, for example, fall below the wafer lifter basket and into wafer passivation area 12. When wafer lifter basket 22 is then lowered into wafer passivation area 12 (since wafer lifter basket assembly 20 does not "know" that the wafer has fallen off), it crushes the wafer or causes serious damage thereto. Similarly, an improperly placed wafer on wafer lifter basket 22 after passivation could catch onto an edge of wafer passivation area 12, the wafer lifter basket 22 continuing to rise, and cause damage to or break the wafer. The present invention solves such problems by providing a wafer lifter basket assembly where the wafer lifter basket disengages from the base upon encountering a force of at least a predetermined level, for example, a force equivalent to the weight of a typical semiconductor wafer.

Figure 2:
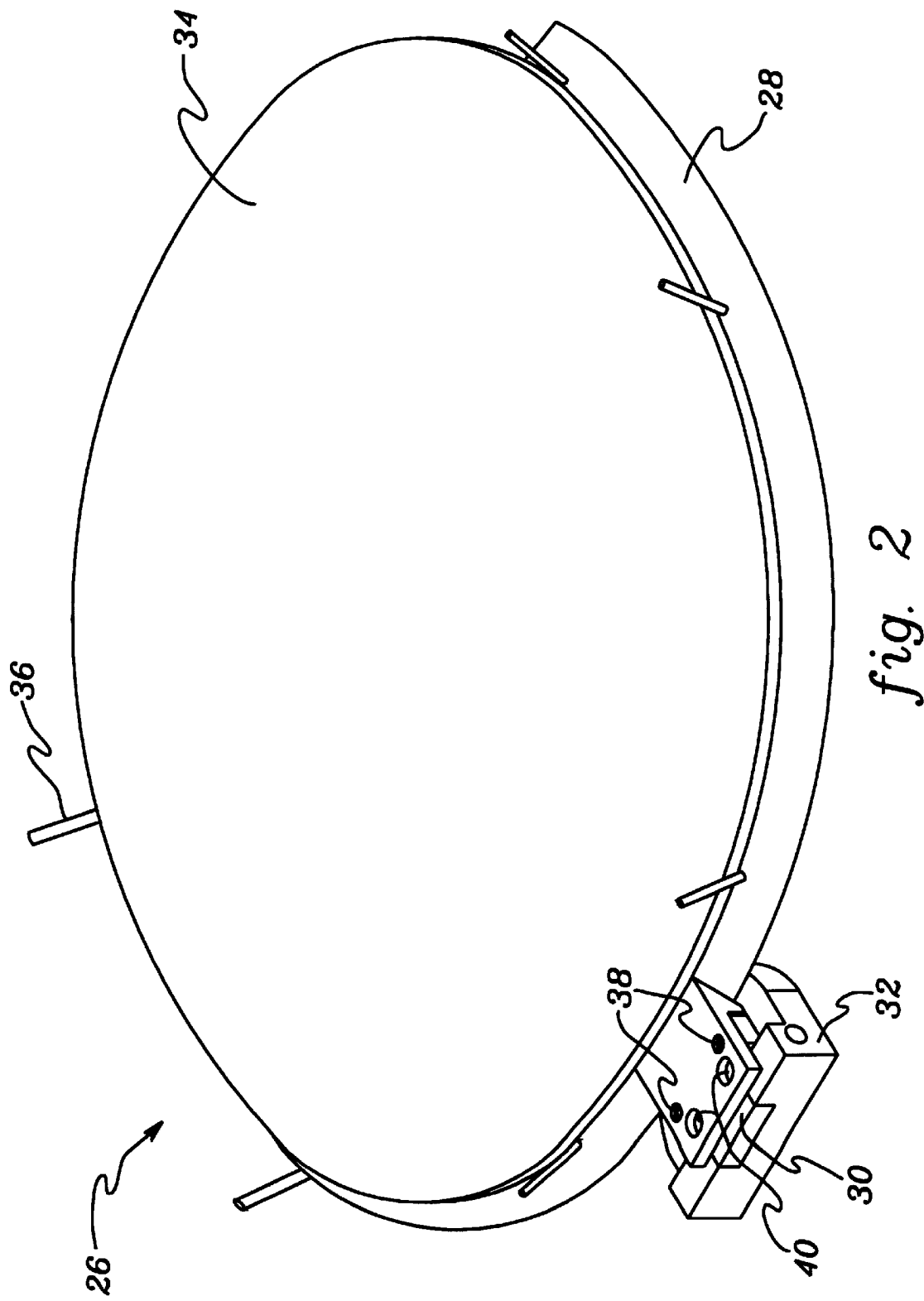
FIG. 2 depicts a wafer lifter basket assembly according to the present invention.

FIG. 2 depicts a wafer lifter basket assembly 26 according to the present invention. As used herein, the term "wafer lifter basket" includes all mechanisms that hold, carry or otherwise transport a semiconductor wafer during processing. Assembly 26 comprises a wafer lifter basket 28, bracket 30 and bracket holder 32. Semiconductor wafer 34 rests on wafer lifter basket 28, and is centered thereon via a plurality of angled wafer guides, such as wafer guide 36, extending out from wafer lifter basket 28 at an angle of approximately 120° with respect to the semiconductor wafer. Wafer lifter basket 28 is mounted to bracket 30 via screws 38. The wafer lifter basket 22 of FIG. 1 has been retrofitted as wafer lifter basket 28, in order to fit onto a new base, i.e., bracket 30 and bracket holder 32. Screws 38 lie in new screw holes made in wafer lifter basket 28 to retrofit same. Existing screw holes 40 were previously used to mount wafer lifter basket 28 to a single piece base 24 (see FIG. 1) such that release of wafer lifter basket 28 was not possible. Bracket 30 is releasably connected to bracket holder 32 via spring-loaded plungers (see FIG. 4). When wafer lifter basket 28 encounters a sufficient force, the basket and bracket 30 are released from bracket holder 32, the force overcoming the spring-loaded plungers. A sufficient force could be, for example, a force equivalent to the weight of semiconductor wafer 34.

Retrofitting the existing wafer lifter basket assembly involves first separating the wafer lifter basket 28 from the old base 24 by removing the screws from existing screw holes 40. New screw holes are then made to accommodate screws 38. A new base is provided and includes a bracket 30 and bracket holder 32. The wafer lifter basket 28 is then mounted to bracket 30, and bracket 30 is releasably connected to bracket holder 32. Spring-loaded plungers 52 (see FIG. 4) are then set.

Figure 3:
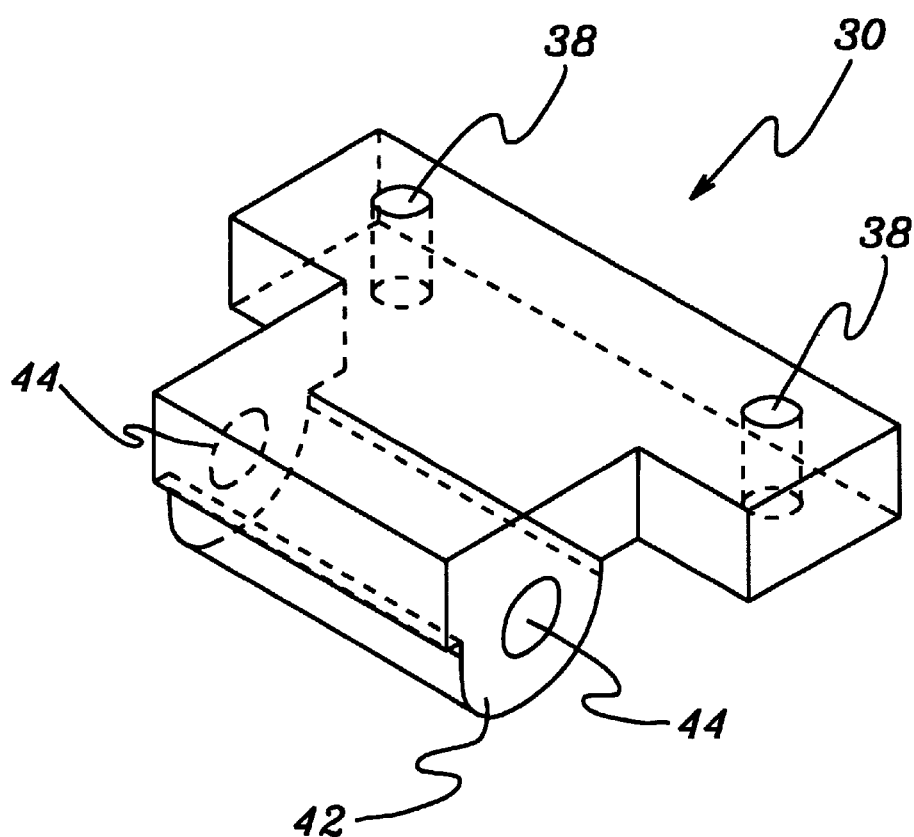
FIG. 3 depicts details of the bracket of the wafer lifter basket assembly of FIG. 2.

FIG. 3 depicts bracket 30 of FIG. 2 in detail. Bracket 30 comprises screw holes 40 into which screws 38 are accepted for the mounting of wafer lifter basket 28. Bracket 30 further includes rounded portion 42 that fits into a recessed area (see FIG. 4) of bracket holder 32. At the center of rounded portion 42 are indentations 44 in which ball bearings from spring-loaded plungers (see FIG. 4) are accepted for releasably holding wafer lifter basket 28 and bracket 30 to bracket holder 32.

Figure 4:
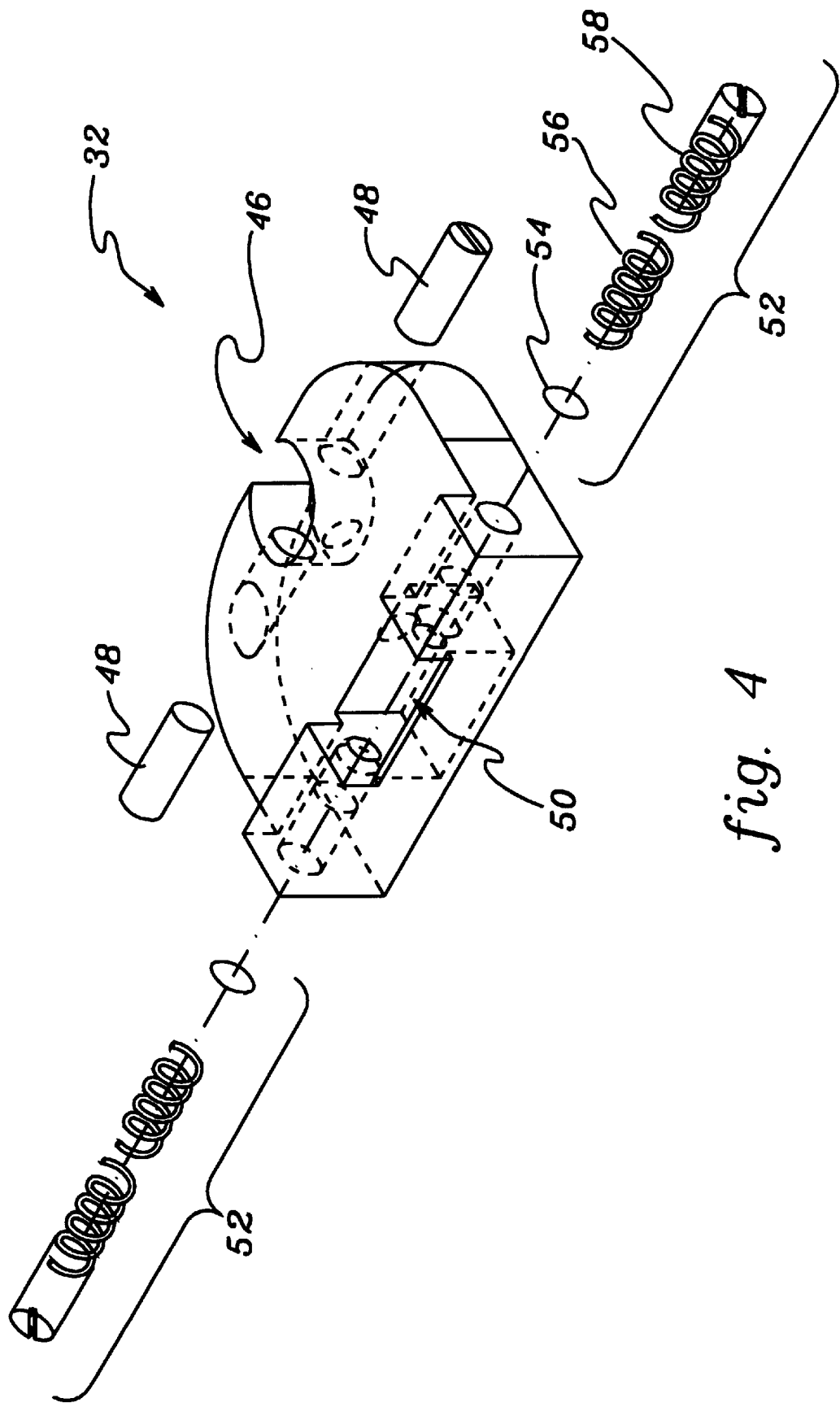
FIG. 4 depicts details of the bracket holder of the wafer lifter basket assembly of FIG. 2.

FIG. 4 depicts bracket holder 32 of FIG. 2 in greater detail. Bracket holder 32 comprises actuator holding area 46 for accepting actuator 18, and holding same via a pair of set screws 48. Bracket holder 32 also comprises recessed area 50 for accepting rounded portion 42 of bracket 30. Bracket 30 is releasably held to bracket holder 32 via a pair of spring-loaded plungers 52. Each spring-loaded plunger comprises a steel ball bearing 54, a spring 56 and a set screw 58. The tension with which plungers 52 hold bracket 30 to bracket holder 32 can be adjusted via set screws 58, thereby setting the force that would be needed to release the wafer lifter basket. Assembly 26 could be initially set by screwing set screws 58 until wafer lifter basket 28 no longer releases from the base (here, the base comprises bracket 30 and bracket holder 32), with the weight of semiconductor wafer 34.

In an alternative embodiment, the wafer lifter basket and bracket could be designed as a single piece, rather than having the wafer lifter basket mounted to the bracket. However, having bracket 30 and wafer lifter basket 28 be two separate pieces allows for some degree of centering of the wafer lifter basket, such that wafer 34 is properly centered on vacuum spinner chuck 14. In addition, it will be understood that the previously described preferred embodiment could take other forms. However, the particular mechanism used to releasably attach the wafer lifter basket to a base should preferably be able to release the basket when a sufficient force is applied from either above or below the wafer lifter basket.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

We claim:

1. A semiconductor wafer lifter basket assembly for releasably holding a semiconductor wafer during transportation into and out of a processing station including a basket transportation mechanism, the semiconductor wafer lifter basket assembly comprising:

a base coupleable to the basket transportation mechanism;

a wafer lifter basket for supporting the semiconductor wafer; and means for releasably coupling said wafer lifter basket to said base such that said wafer lifter basket releases from said base in response to encountering a force of at least a predetermined level during transportation or processing to reduce potential damage to the semiconductor wafer from the force.

2. The apparatus of claim 1 wherein said means for releasably coupling comprises a pair of spring-loaded plungers.

3. The apparatus of claim 2 wherein said pair of spring-loaded plungers are tension-adjustable.

4. The apparatus of claim 2, wherein said base comprises a bracket and a bracket holder, wherein said wafer lifter basket is mounted to said bracket, and wherein said pair of spring-loaded plungers are housed within one of said bracket and said bracket holder to releasably hold said bracket to said bracket holder.

5. The apparatus of claim 4, wherein said wafer lifter basket includes a protruding connection area, said semiconductor wafer lifter basket assembly further comprising adjustable connection means for connecting said wafer lifter basket to said bracket at said protruding connection area such that positioning of said wafer lifter basket with respect to said bracket is adjustable.

6. The apparatus of claim 4, wherein said pair of spring-loaded plungers are housed in said bracket holder.

7. The apparatus of claim 1, wherein said force is greater than the weight of a semiconductor wafer.

* * * * *